(12) United States Patent
Piasecki et al.

(10) Patent No.: US 6,956,518 B1
(45) Date of Patent: Oct. 18, 2005

(54) METHOD AND APPARATUS FOR SUBCLOCKING A SAR ANALOG-TO-DIGITAL CONVERTER

(75) Inventors: Douglas Piasecki, Austin, TX (US); Ka Y. Leung, Austin, TX (US); Kenneth Fernald, Austin, TX (US)

(73) Assignee: Silicon Labs CP, Inc., Austin, TX (US)

( * ) Notice: Subject to any disclaimer, the term of this patent is extended or adjusted under 35 U.S.C. 154(b) by 0 days.

(21) Appl. No.: 10/816,564

(22) Filed: Mar. 31, 2004

(51) Int. Cl.⁷ .............................................. H03M 1/50
(52) U.S. Cl. ..................................... 341/166; 341/155
(58) Field of Search ............................ 341/121, 122, 341/142, 155, 166; 34/172

(56) References Cited

U.S. PATENT DOCUMENTS

| | | | | |
|---|---|---|---|---|
| 4,620,179 A | * | 10/1986 | Cooper et al. | 341/156 |
| 4,851,838 A | * | 7/1989 | Shier | 341/121 |
| 6,181,269 B1 | * | 1/2001 | Nishiuchi et al. | 341/164 |
| 6,232,905 B1 | * | 5/2001 | Smith et al. | 341/155 |
| 6,664,908 B2 | * | 12/2003 | Sundquist et al. | 341/143 |
| 6,771,202 B2 | * | 8/2004 | Watanabe et al. | 341/155 |

* cited by examiner

Primary Examiner—Jean Jeanglaude
Assistant Examiner—Linh V Nguyen
(74) Attorney, Agent, or Firm—Howison & Arnott, L.L.P.

(57) ABSTRACT

Method and apparatus for subclocking a SAR analog-to-digital converter. A method is disclosed for clocking the operation of a SAR analog-to-digital converter (ADC). A low frequency clock and a high frequency clock are provided. An analog input voltage is then tracked during a tracking phase to sample the value thereof. A conversion cycle referenced to an edge of the low frequency clock is then initiated. The sampled data is then converted in a conversion operation during a data conversion cycle, which conversion operation requires a plurality of conversion clock cycles, the timing of at least a portion of the conversion operation is controlled during the data conversion cycle utilizing the high frequency clock as the conversion clock.

42 Claims, 9 Drawing Sheets

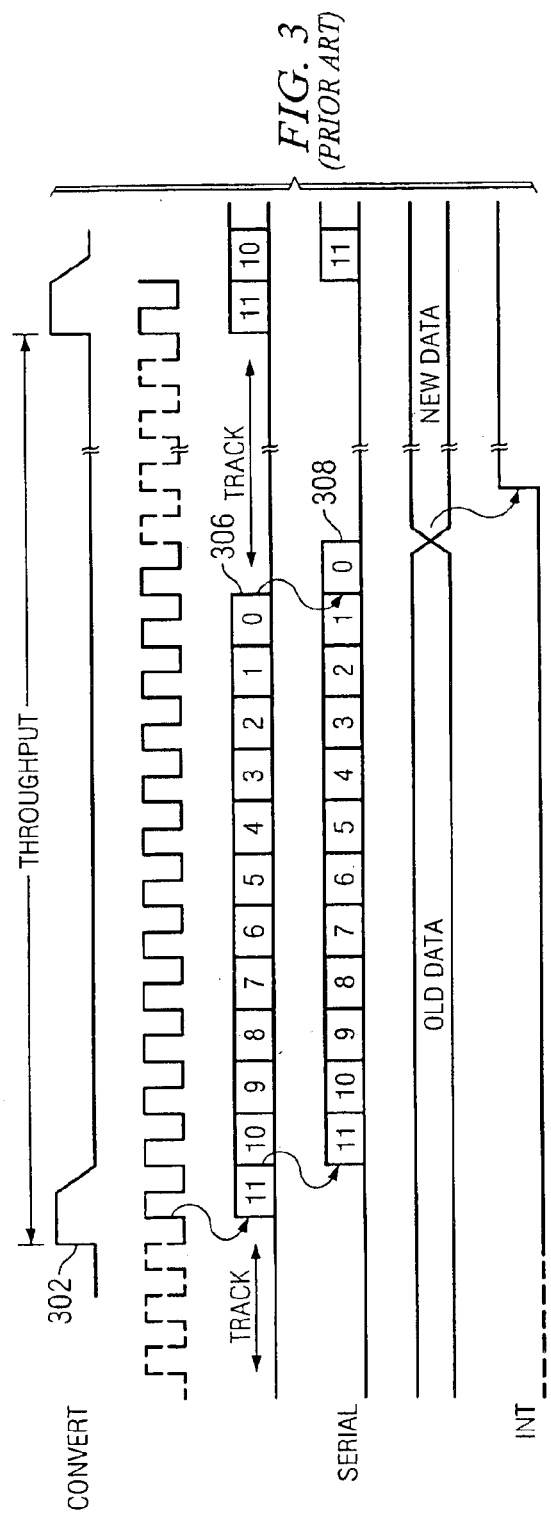
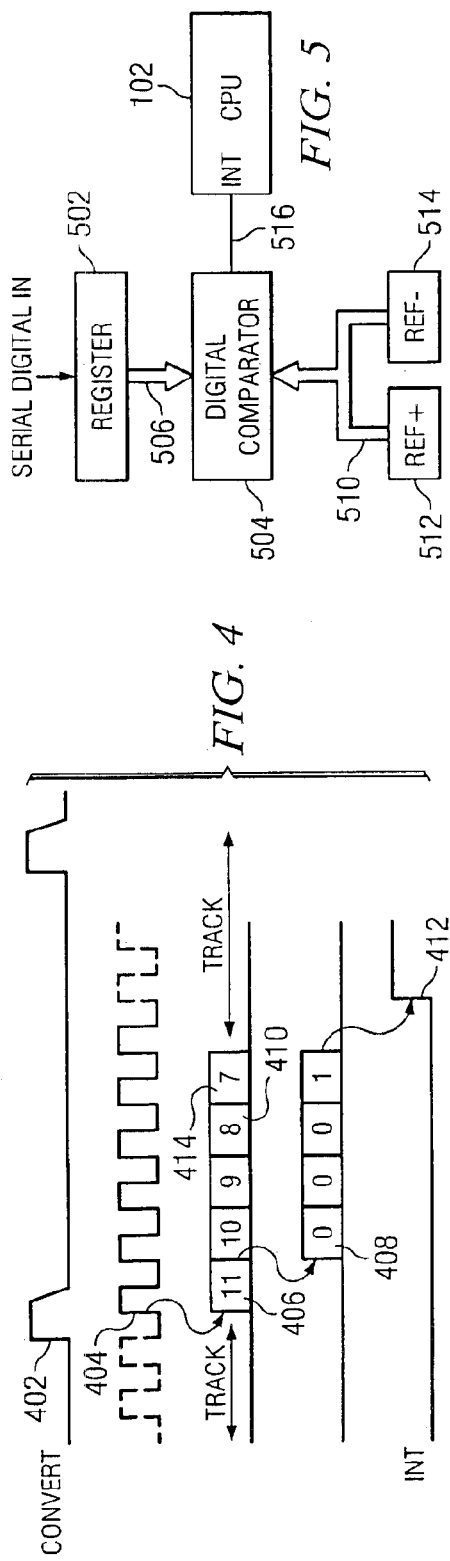

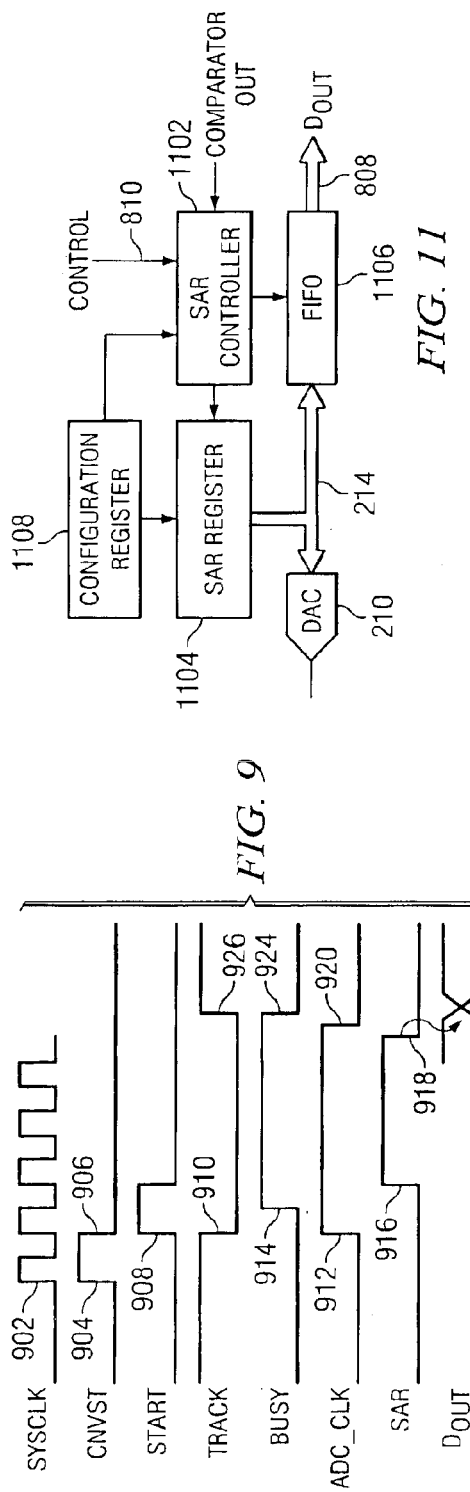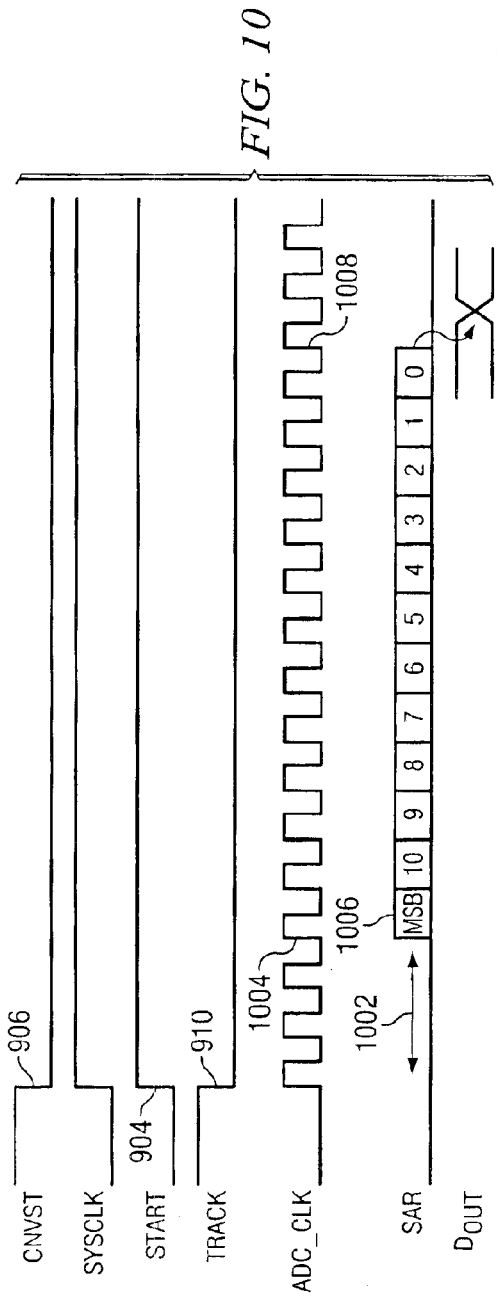

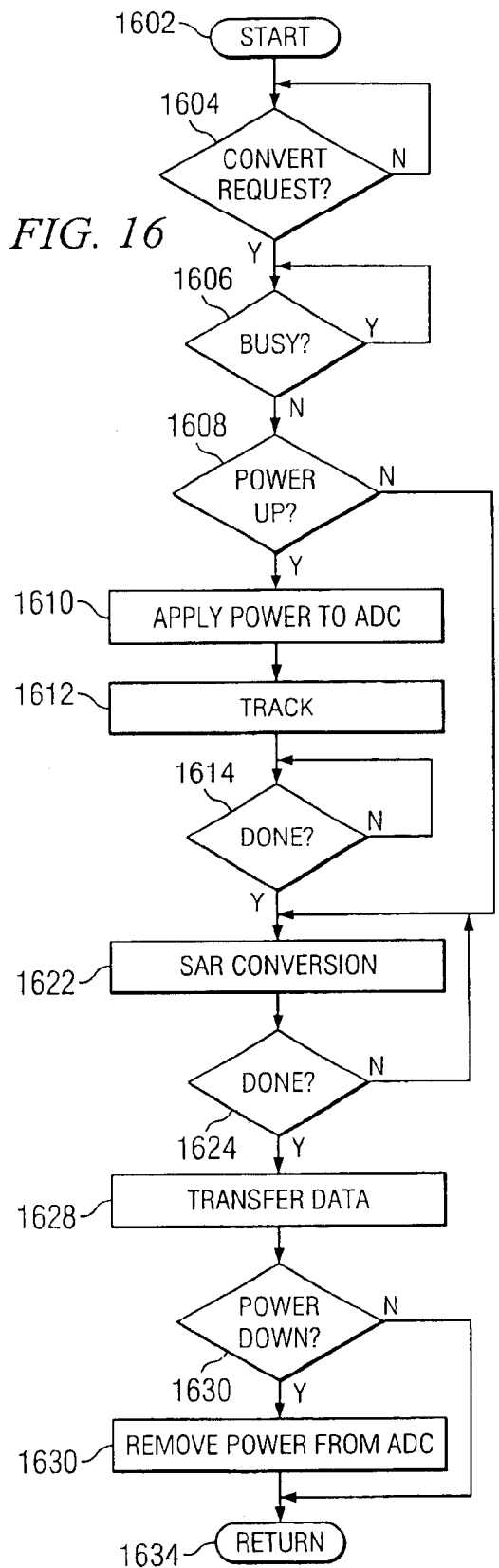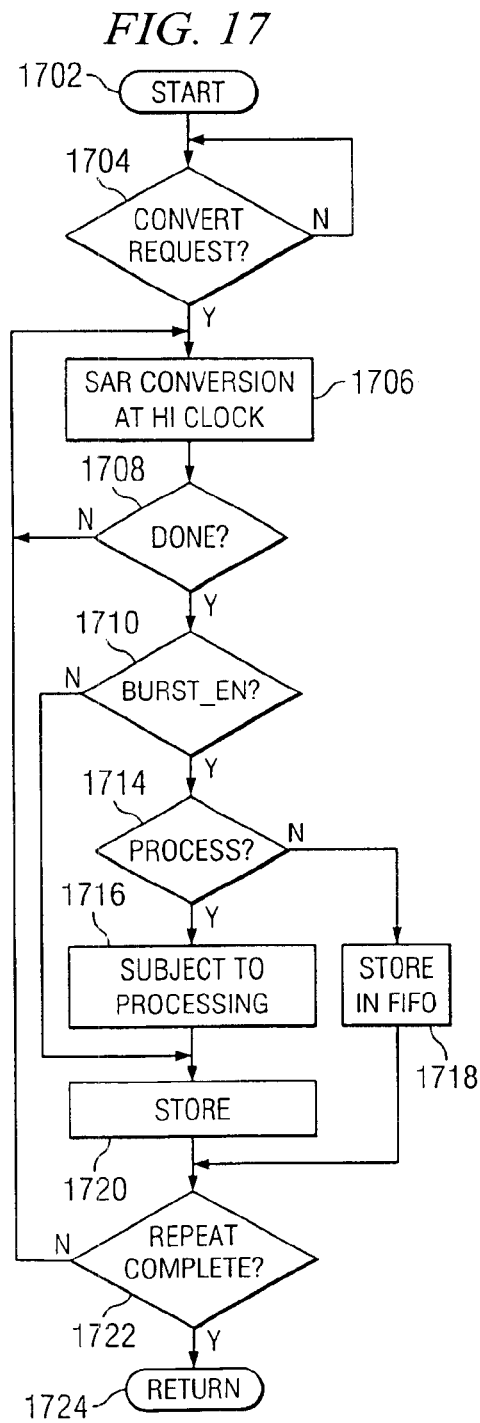

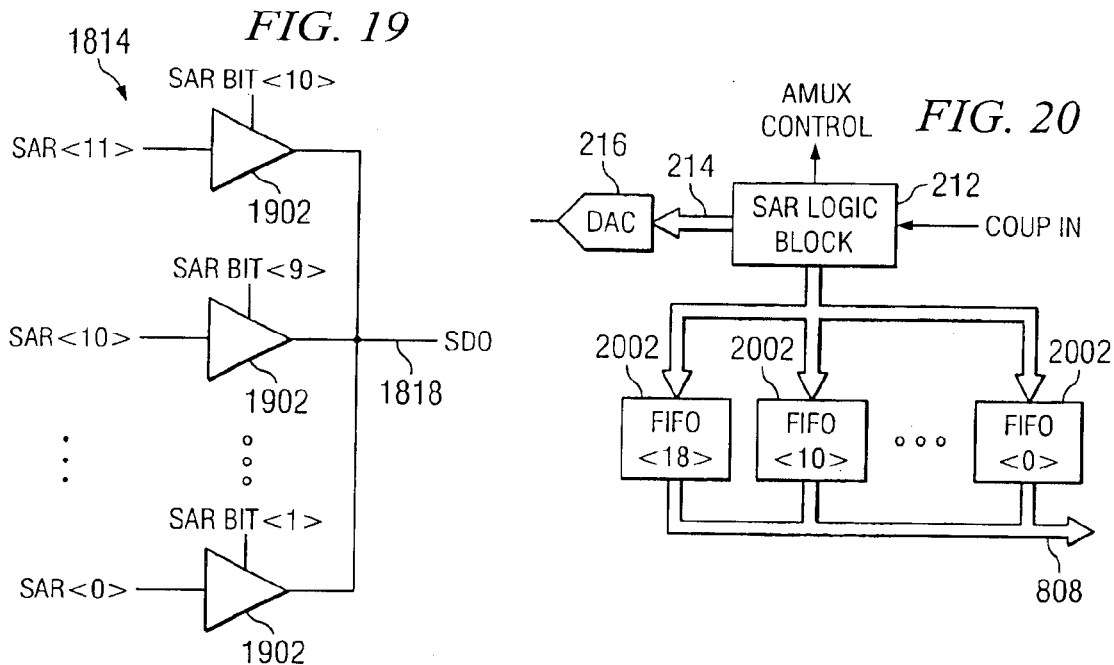
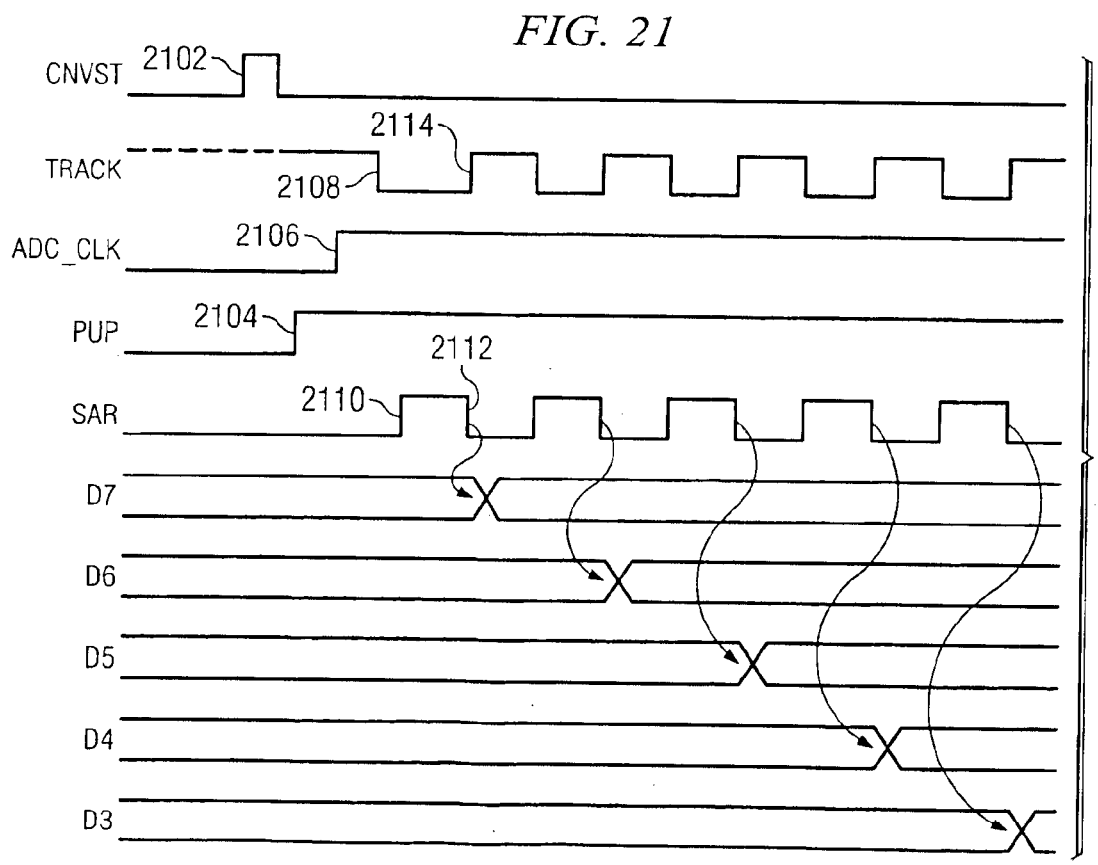

US 6,956,518 B1

METHOD AND APPARATUS FOR SUBCLOCKING A SAR ANALOG-TO-DIGITAL CONVERTER

TECHNICAL FIELD OF THE INVENTION

The present invention pertains in general to data converters and, more particularly, to a SAR analog-to-digital converter operating in a mixed signal processor with multiple clocks.

CROSS-REFERENCE TO RELATED APPLICATIONS

The present application is related to co-pending U.S. patent application Ser. No. 10/815,416, entitled "SAR ANALOG-TO-DIGITAL CONVERTER WITH ABORT FUNCTION," filed of even date herewith, which is incorporated herein by reference.

BACKGROUND OF THE INVENTION

Mixed signal processor units are integrated circuits that have contained thereon a digital processing section and analog section. The analog section is typically comprised of an analog multiplexer and an analog-to-digital converter, in addition to a digital-to-analog converter. This allows analog data to be sampled on a plurality of analog data inputs, converted to digital signals and then supplied to the processing section for processing thereof. On the digital processing side, the digital processor can operate at multiple frequencies. These frequencies are from internal clocks that generate a plurality of frequencies. Typically, there are two distinct clocks, a high frequency clock and a low frequency clock. The low frequency clock is typically utilized such that the processor can go into a low power mode wherein the processing is carried out at a very low frequency and consumes considerably less power. Typically, the high frequency rate is on the order of 20–25 MHz and the low frequency clock rate is on the order of 32 KHz. The problem is that, when operating at the low frequency, the ADC must also operate at the low frequency. Typically, the ADC is facilitated utilizing a successive approximation algorithm that requires a plurality of bits to be tested during each data conversion cycle. Thus, at the low frequency, the throughput of the ADC is very slow, since its conversion clock can not operate at higher than the clock rate of the high frequency clock. Further, both at the high frequency and the low frequency, the data conversion operation can be influenced by noise generated in the digital processing section. Therefore, if both the ADC and the digital processing section are operating on the same clock frequency, it is possible for noise to be injected into the analog section from the digital section, this being a conventional problem in mixed signal devices.

SUMMARY OF THE INVENTION

The present invention disclosed and claimed herein, in one aspect thereof, comprises a method for clocking the operation of a SAR analog-to-digital converter (ADC). A low frequency clock and a high frequency clock are provided. An analog input voltage is then tracked during a tracking phase to sample the value thereof. A conversion cycle referenced to an edge of the low frequency clock is then initiated. The sampled data is then converted in a conversion operation during a data conversion cycle, which conversion operation requires a plurality of conversion clock cycles, the timing of at least a portion of the conversion operation is controlled during the data conversion cycle utilizing the high frequency clock as the conversion clock.

BRIEF DESCRIPTION OF THE DRAWINGS

For a more complete understanding of the present invention and the advantages thereof, reference is now made to the following description taken in conjunction with the accompanying Drawings in which:

FIG. 3 illustrates a timing diagram for a prior art operation of a SAR ADC;

FIG. 4 illustrates a timing diagram for the SAR ADC with the abort feature;

FIG. 5 illustrates a block diagram of the digital compare circuit;

FIG. 9 illustrates the timing diagram for the subclocking operation;

FIG. 10 illustrates a more detailed timing diagram for the subclocking feature illustrating the high frequency clock;

FIG. 11 illustrates a more detailed diagram of the ADC illustrating the SAR register and the Repeat function;

FIGS. 15a–15c illustrate the ADC registers;

FIG. 16 illustrates a flow chart for the subclocking operation;

FIG. 17 illustrates a flow chart for the conversion operation utilizing subclocking in response to a single converter request;

FIG. 19 illustrates a logic diagram of the parallel-to-serial converter;

FIG. 20 illustrates an alternate embodiment of the subclocking operation; and

FIG. 21 illustrates a timing diagram for the alternate embodiment of FIG. 20.

DETAILED DESCRIPTION OF THE INVENTION

Figure 1:
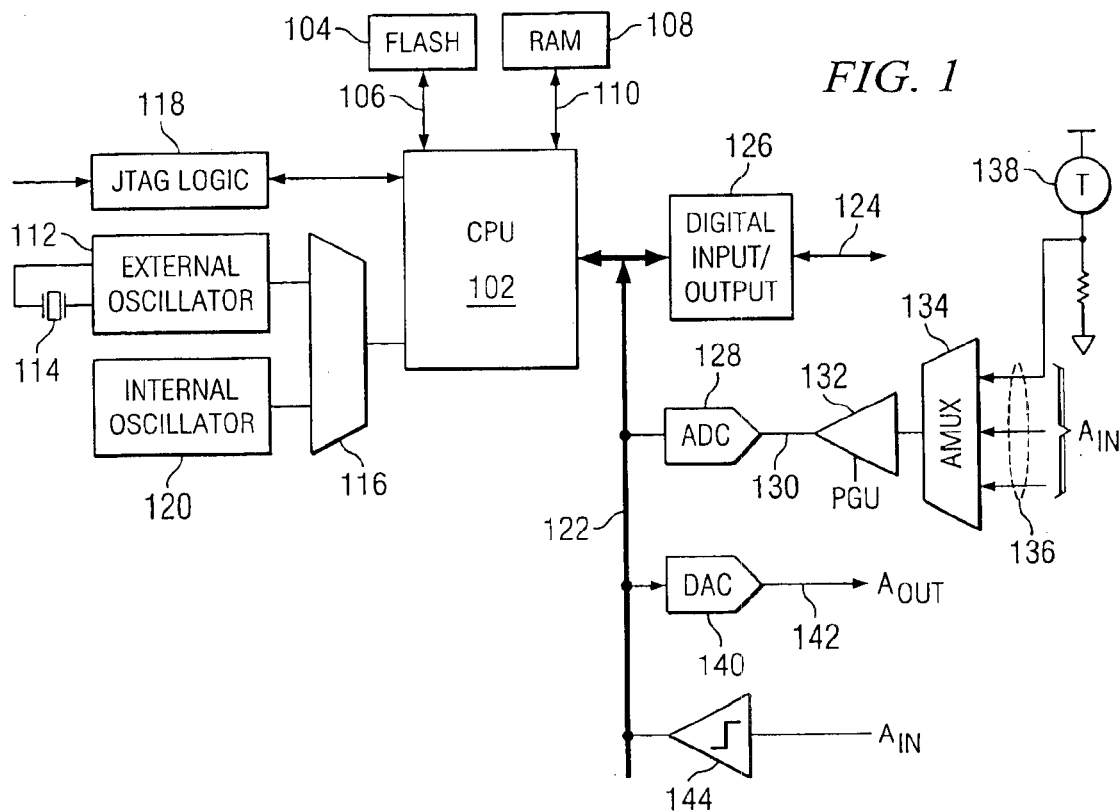
FIG. 1 illustrates a block diagram of a mixed signal processor having an analog-to-digital converter associated therewith.

Referring now to FIG. 1, there is illustrated a block diagram of a mixed signal integrated circuit including a SAR analog-to-digital converter (ADC). This is a conventional processor based mixed signal circuit of the type C8051F410, manufactured by Silicon Laboratories, the present assignee. This mixed signal circuit includes at the heart thereof a CPU 102, which is an 8051 CPU, a conventional processor core.

This CPU 102 interfaces with memory, there being a flash memory 104 interfaced with the CPU 102 through a bus 106, and a random access memory (RAM) 108 interfaced to the CPU 102 through a bus 110.

The CPU 102 operates on multiple clocks. There is provided an external oscillator circuit 112, which is operable to be controlled by an external crystal 114, it being noted that the external oscillator circuit 112 is actually disposed on-chip. This oscillator is a high frequency oscillator and operates at a frequency of around 25 MHz. This is input to the CPU 102 through a selection multiplexer (MUX) 116. Alternatively, the CPU 102 can operate off of a low frequency internal oscillator 120, this being a 32 KHz crystal oscillator. Typically, the primary processing function of the CPU 102 is carried out with the high frequency oscillator 112 and, when the CPU 102 is placed in a "sleep" mode, the lower frequency oscillator is utilized. The processing operations are typically minimal at the lower frequency. The CPU 102 also includes a JTAG logic block 18 that is operable to interface external data with the CPU 102 for writing in the flash memory 104, this being a conventional operation.

The CPU 102 interfaces with a digital on-chip bus 122, which interfaces with a plurality of digital input/output pins 124 through a digital I/O block 126. This digital I/O block 126 is operable to allow various digital interfaces. This can be parallel digital data or it can be serial data. Serial data will typically be interfaced with some type of serial data format. This can be an RS232 data format, an I²C format, or any other type of serial data format. This allows digital data to be received or transmitted. Additionally, the digital bus 122 is interfaced with the digital input of an analog-to-digital converter (ADC) 128 to receive digital data therefrom. The input to the ADC 128 is provided on an input analog line 130, which comprises the output of the programmable amplifier 132. The analog input to the amplifier 132 is received from the analog multiplexer 134, which receives a plurality of analog inputs on analog input lines 136. These analog inputs can be received from any source, such as transducers, etc. One embodiment of this analog multiplexer is illustrated in U.S. Pat. No. 6,507,215, issued Jan. 14, 2003, and assigned to the present Assignee, which reference is incorporated herein in its entirety by reference. One illustrated input to the multiplexer 134 is from a temperature sensor 138, which is an internally generated temperature value typically generated from a band-gap reference voltage generator contained on-chip. The output of this temperature sensor is connected to one of the analog input lines 136 and is selected for measuring ambient temperature of the chip, which may be the ambient temperature of the surroundings.

In addition to the analog multiplexer 134 and the ADC 128, digital information on the bus 122 can be provided as the input to a digital-to-analog converter (DAC) 140, which can be converted to an analog output signal on an analog output line 142. The comparator function is provided by a comparator 144 which receives an analog input for comparison to an internally generated reference voltage or to an external reference voltage (not shown) to provide a selectable output that can be driven to the digital bus 122 or to an interrupt input on the CPU 102. Although illustrated as being connected to the digital bus 122, it should be understood that the output of comparator 144 could be connected to multiple different interrupts on the processor.

Figure 2:
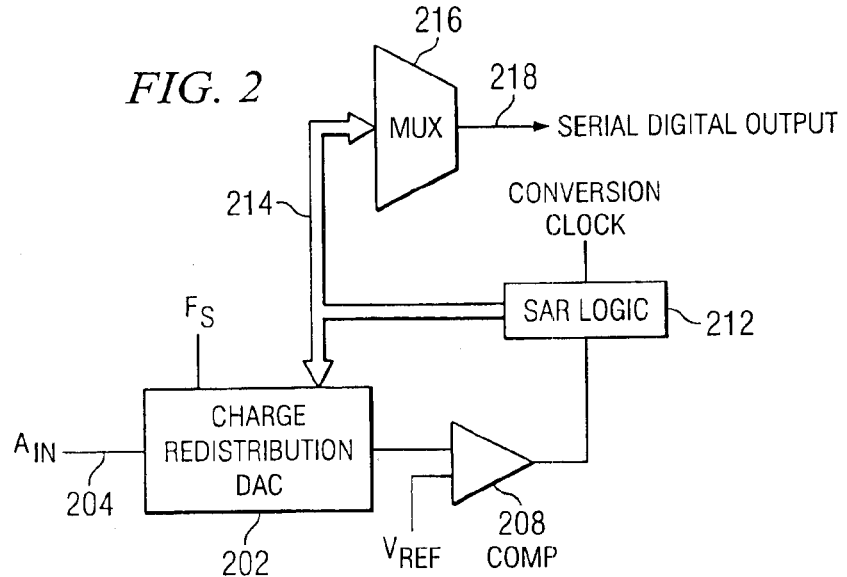
FIG. 2 illustrates a block diagram of the analog-to-digital converter.

Referring now to FIG. 2, there is illustrated a block diagram of the ADC 128. A conventional SAR ADC is comprised of a charge redistribution DAC 202 on the input that is operable to receive an analog input signal on an analog input line 204. A data conversion operation is initiated in response to receiving a convert start request from the CPU 102. This analog voltage is sampled at a sampling frequency of $f_s$, which is generated by a sample clock, derived from the high frequency or low frequency oscillator. This is lower in frequency than the conversion clock. The output of the charge redistribution DAC 202 to one input of a comparator 208, for comparison to a reference voltage. A digital input thereto is received from a digital bus 214. The comparator 208 is operable to compare the voltage on the input thereof against the reference voltage, this being, in one embodiment, the common mode voltage. If it is higher than the reference voltage, then the output of the comparator 208 changes to indicate this to a SAR logic block 212, this being a conventional logic block. The SAR logic block 212 is operable to provide a digital output on the digital bus 214 to drive the charge redistribution DAC 202. The SAR logic block 212 basically steps through each bit of the n-bit value for the n-bit ADC to test that bit and, if positive, then it retains the value of that bit. The testing procedure to determine the value of the SAR bits is a conventional binary SAR search algorithm. When the conversion cycle is complete, there will be n-bits determined. This will be provided as an output to a register (not shown). It should be understood that a differential SAR data converter could be used to receive a differential analog input, which would utilize a differential comparator.

In the present disclosure, there is an abort feature that is provided by examining one or more of the bits on the bus 214 as they are being tested. This is facilitated by inputting each bit on the bus 214 to an n-bit multiplexer 216 to provide a serial digital output on a serial digital output line 218. This allows the serial data to be output for testing by a digital comparator, as will be described herein below. However, it should be understood that the output could be parallel data as opposed to serial data.

Referring now to FIG. 3, there is illustrated a timing diagram illustrating the conventional operation of a SAR data converter. Prior to the conversion cycle, there will be a "track" cycle wherein data is being sampled on an input sampling capacitor. When a convert signal is raised high at a time 302, a conversion cycle is requested by the CPU 102. A conversion clock will provide the timing for the conversion operation and, on a selected rising edge thereof, a test of the MSB will be initiated, wherein the MSB bit, bit 11 in a 12-bit ADC, will be determined. This is determined by setting the MSB to a "1" and then testing the output of the comparator associated with the SAR operation. If this MSB is determined by the test to be a "1" at this time, it is then set as such, otherwise it is set to a "0." At the end of the test for this bit, the bit being set is retained on the output of the SAR logic block 212. At the end of the test, this bit is also transferred to a serial data output and then the next bit, bit 10, tested, set or not set, retained on the output of the SAR logic block 212 and then transferred out to the serial data output. This will continue for the entire 12 bits until a bit "0" at a block 306. At block 306, the last bit, bit "0" is tested and then the test operation is complete and the last bit is transferred to the serial data output at a block 308. At the end of this test, the data word, the 12-bit word, is transferred to the output register (not shown) as the new data. It is noted that the data can be transferred as a parallel data word or it can be transmitted as a serial data word. However, conventional SAR ADCs will require that the entire n-bits be tested prior to the completion of the conversion cycle. This will start the next conversion cycle after the appropriate track time.

There are situations where it is not necessary to test all n-bits of the n-bit SAR ADC. For example, in a compare operation, it may only be necessary to test the MSB to determine if the analog signal exceeds one-half the full scale voltage. If so, then this may constitute a positive result and this is all the testing that is to be done. If it is less than one-half of the full scale voltage, this also is all the testing that needs to be done to determine that it is a negative result. Therefore, it is only necessary to test a single bit and, therefore, the remaining bits need not be tested and that portion of the conversion in cycle will be wasted. In the example of FIG. 4, there is provided a situation wherein the threshold voltage is set at 1/16 th full scale voltage. Thus, this would mean that, at a minimum, the fourth MSB must be a "1." Therefore, if the first MSB tests positive, or the second or third MSB test positive, this would indicate that the voltage is greater than the 1/16 full scale voltage. Additionally, the fourth MSB would also indicate a positive result. If the first four bits test negative, i.e., they are determined to be set to "0," then testing of the remaining bits will also result in a negative compare operation, as the analog input voltage has already been determined to be less than 1/16 th full scale voltage. Thus, at a maximum, only the first four MSBs would need to be tested.

In this example, the convert cycle is initiated at an edge 402 on the convert signal, and, at the next rising edge of the conversion clock, at a rising edge 404, the first MSB is tested at a block 406. The result of this is transferred to the serial output at an edge 408. If it is a "1," this would be a positive test. However, in this example, the first, second and third MSBs are tested to be a "0" and the fourth MSB is tested at a block 410 and it is determined to be a logic "1." This will result in the generation of a high output, which in this embodiment, generates an interrupt to the processor at an edge 412, this being the output of a digital compare operation going to a logic high value. At this point, the conversion operation will be "aborted" at a block 414 prior to the completion of a convert cycle, thus preventing resolution of the lower order bits and the complete 12-bit value, and then the track mode will be entered into for the next sample. The CPU 102 provides an abort signal to the ADC 128 for this function. Since one clock cycle of the convert clock is required to transmit the test for the fourth MSB to the serial output, one or more additional bits may be tested before the digital compare operation will be complete. Also, this is only the case where the data is transferred out to a serial data output. (It is noted that the digital compare operation is a different compare operation than that for the operation of the SAR logic.) Of course, this depends upon the logic implemented. It could be that a dual port register is utilized wherein, during the testing of each bit, the digital compare operation is carried out at substantially the same time to increase the speed thereof. However, the disclosed embodiment discloses the serial output. It can be seen, therefore, that by early termination of the conversion cycle based upon a condition deterministic wherein a certain condition is met prior to all of the bits being tested, the next conversion cycle can be begun or it may be that the process is released for other operations. For situations wherein a plurality of analog inputs must be tested, this allows the conversion to be "cut short" based upon a positive result such that the next conversion operation can be initiated at an earlier time. Additionally, the length of the conversion cycle can be preset based upon the knowledge that only a certain number of the n-bits in the ADC need be tested. In the example of FIG. 4, for example, only four bits are required to be tested in order to determine if a true result exists, such that any one of the four bits being high results in the abort of the conversion cycle. Since there is no need to test the remaining bits, the conversion cycle can be pre-limited to only a finite number of bits. Thus, the amount of time to cycle through all of the analog inputs can be shortened. By having a fixed abort length, it is then possible to change an n-bit ADC to a (n−x)-bit ADC, with "x" being a programmable variable.

Referring now to FIG. 5, there is illustrated a block diagram for the digital compare operation. The serial digital output from the multiplexer 216 is provided as an input to a serial-to-parallel converter 502, illustrated as a register. This basically stores the serial data in registers for input to a digital comparator 504 on a digital bus 506. This will typically be a wider data bus than is necessary, such that the register 502 can accommodate all n-bits and the data bus 506 can accommodate all n-bits. A reference voltage input is provided on a bus 510 which is the reference voltage compared to the digital output of the register 502. There are illustrated two reference voltages, a positive reference voltage register 512 and a negative voltage reference register 514. This is for the purpose of providing a "window" comparator, wherein a voltage range is defined. If the voltage is less than the negative reference voltage or greater than the positive reference voltage, this could indicate a positive test, or the positive test could be that it must be greater than the negative reference voltage and less than the positive reference voltage. Again, only a predefined number of bits are required in order to determine this result. Also, this determined number of bits is less than the total of the n-bits, such that the lower order bits need not be tested. A digital comparator 504 will then generate an interrupt, in this example, on line 516 to the CPU 102. However, this comparator output can be utilized for other purposes than an interrupt.

Figure 6:
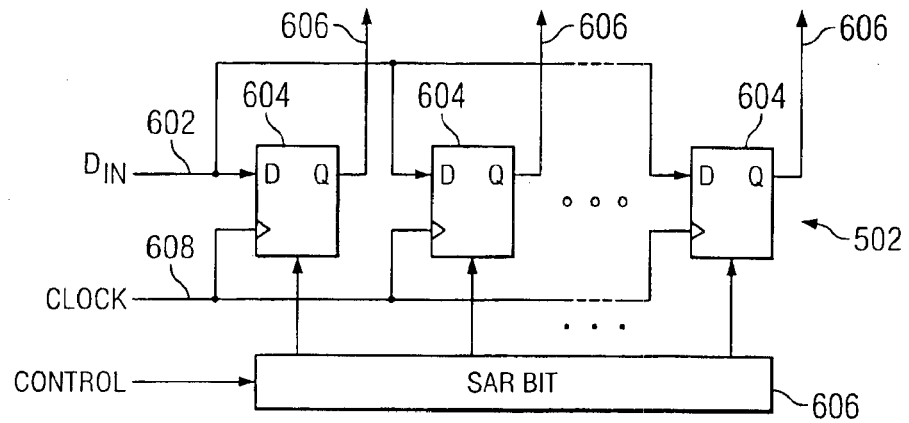
FIG. 6 illustrates a block diagram of the serial-to-parallel data converter.

Referring now to FIG. 6, there is illustrated a logic diagram for the register 502. The serial digital input is received on an input line 602 and input to the D-input of a plurality of D-input flip-flops 604. Each of the flip-flops 604 is associated with one of the n-bits, provided on the Q-outputs thereof on an associated output line 606. Each of the flip-flops 604 is gated by the bit from a SAR bit circuit 606. This SAR bit circuit 606 is part of the SAR logic block 212, this circuit 606 "targeting" each of the bits. Thus, for each bit tested, one of the flip-flops 604 will be activated such that a clock such as the SAR clock, the convert clock, on a clock line 608 connected to a clock input of each of the flip-flops 604 will clock the data through. This is basically data flip-flop, which is set when the particular associated bit is ready. Thus, the particular serial data output is loaded in the correct output position when generated. It is therefore only necessary that the digital comparator 504 compares the desired bits in order to make the determination.

Figure 7:
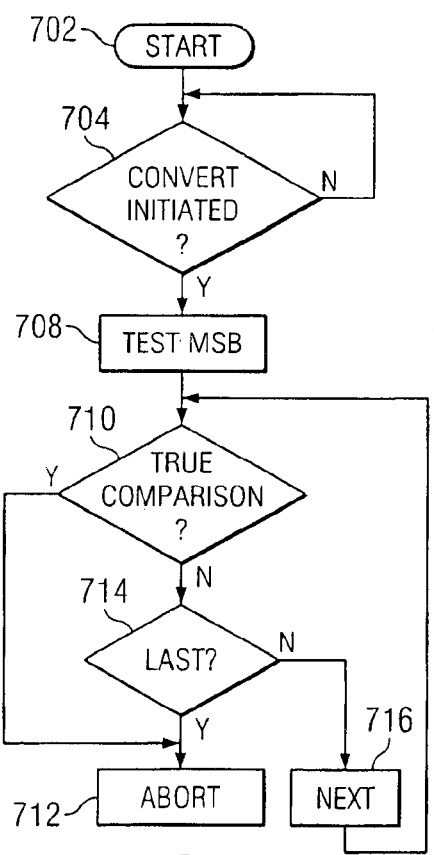
FIG. 7 illustrates the flow chart for the abort operation.

Referring now to FIG. 7, there is illustrated a flow chart depicting the abort feature. The program is initiated at a block 702 wherein the system is in the track operation. The program then flows to a decision block 704 to await the initiation of a convert cycle. If the convert operation has not been initiated, the program flows along the "N" path to the input thereof to continue the tracking operation. At the end of the tracking operation, when the convert operation is initiated, the program flows along the "Y" path from the decision block 704 to a function block 708 to test the first MSB. The program then flows to a decision block 710 to determine if the output of the digital comparator is true. If so, this indicates that a decision has been reached and the program will then flow along a "Y" path to a function block 712 wherein the conversion cycle will be aborted. If not, the program will flow along a "N" path to a decision block 714 to determine if this is the last bit to be tested, this indicating that a result has also been determined the program will flow along a "Y" path to the abort function block 712. However, if this is neither a true comparison nor it is the last bit to be tested when the abort feature is active, the program will flow along the "N" path from the decision block 714 to a function block 716 to await testing of the next bit. The program will then flow back to the input of decision block 710 to again test the output of the comparator to determine if this next bit has a resulted in a true comparison. When a true comparison is made or the last bit in the decision is tested, the program flows to the abort function block 712. It is noted that, when the abort feature is selected, that the test will never exceed the minimum bit needed to be tested.

The abort feature can also be utilized in a mode that allows the bit resolution of the SAR to be adjusted. In this mode, the length of the test prior to the CPU generating the ABORT signal to the ADC will be fixed, such that there will be an automatic abort. Also, there could be provided in the ADC a counter that is incremented by the conversion clock to terminate the conversion cycle early and indicate that it is ready for the next conversion cycle and to begin tracking. In this manner, the bit resolution can be changed by just controlling the comparator configuration. Additionally, the bit resolution could be changed to provide for a first operation that would continue until a threshold were exceeded. At that time, an interrupt is generated and the CPU could reconfigure the comparator to set a new resolution and threshold. This allows for a dynamically changing bit resolution ADC to be realized, wherein the bit resolution is able to be changed in response to various predetermined conditions.

Figure 8:
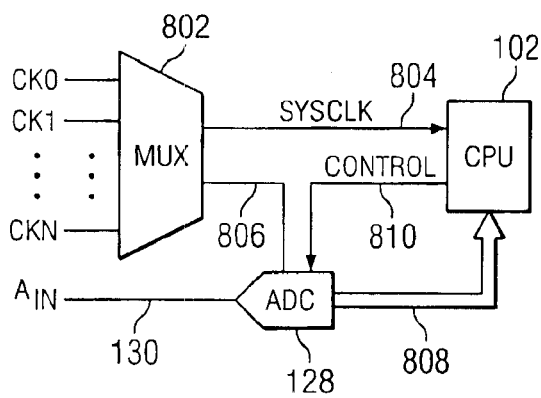
FIG. 8 illustrates a diagrammatic view of the ADC illustrating the use of multiple clocks therewith and the subclocking feature.

Referring now to FIG. 8, there is illustrated another feature of the operation of the ADC in the mixed signal multiprocessor unit. The CPU operation has a multiplicity of clocks associated therewith, these being separate clock generators that are provided to allow the CPU to operate at different frequencies for power consumption and other considerations. Specifically, FIG. 8 is meant to illustrate a low frequency clock and a high frequency clock. However, it should be understood that multiple other clocks could be provided, these clocks either generated off of the high frequency clock or provided by a separate clock generator. The purpose for the multiple clocks is to allow the processor to operate at a lower clock frequency, thus consuming significantly less power. For example, the high clock frequency operates at a frequency between 20–25 MHz and the low frequency clock operates at a frequency of around 32 KHz. Typically, the 32 KHz clock will have associated therewith a crystal, whereas the high frequency clock can be a precision oscillator and can operate without a crystal, but it could be a crystal controlled oscillator. Additionally, although the clock inputs are illustrated as being generated from on-chip oscillators, these clocks can be generated external to the chip.

A multiplexer 802 is operable to select one of the multiple clock signals for input to the CPU 102 by way of illustration. However, this represents a programmable oscillator function or a combination thereof with a separate oscillator. This is the system clock, SYSCLK, input thereto on a line 804. This is one output of the multiplexer 802. The multiplexer 802 receives as input multiple clock signals, CK0, CK1, . . . , CKN. The output 804 comprises one output, with a second output 806 provided that drives the ADC 128. The ADC is operable to receive the analog signal on the input 130, which input 130 is an output that is selected from the multiple inputs on lines 136 via the multiplexer 134. This provides a digital output on a digital bus 808. A digital output 808 allows data to be transferred from the ADC 128 to the CPU 102 for processing thereof.

The CPU 102 is operable to process instructions at the clock rate of SYSCLK. The CPU 102 periodically, in accordance with the programming instructions therein, will send out a convert request from a control line 810 to the ADC 128 such that the ADC 128, operating independently, will convert an analog value on an analog input to a digital value as digital data. The CPU 102 also provides configuration information to the ADC 128 and also provides selection input signals to the analog multiplexer 134. Therefore, the ADC 128 will be connected to one of the analog input lines 136 for sampling analog values thereon during a track mode, and then process this sampled analog information in the ADC utilizing a SAR data conversion algorithm. This SAR conversion algorithm, as described herein above, requires multiple internal clocks of a conversion clock to determine the bit values of the resultant digital value. Therefore, if the ADC has n-bits of resolution, this requires n-tests of the n-bits to be performed, requiring at least n-clocks of the conversion clock to complete the data conversion operation. Thereafter, the results of the conversion, the resultant digital value, will be transferred to an internal register for interface with digital bus 808. As will be described herein below, the multiplexer 802 is operable to output a clock signal to separately clock the ADC 128 with a higher frequency conversion clock during the conversion operation, such that the conversion operation is completed within a very short period of time, in one embodiment, during a single clock cycle of the SYSCLK. This provides a number of benefits. First, the ADC 128 can be powered down during non-conversion operations, such that it utilizes less power. Second, the results are available at an earlier time. For example, a convert request may require a multiprocessor chip having an analog multiplexer 134 that is operable to receive eight analog input values on the analog input lines 136. In this situation, the convert request could initiate an operation wherein, at the end of each conversion cycle for each analog input line, the next analog input to the multiplexer 134 on the input lines 136 would be selected, or each convert request could be associated with a single analog input requiring each convert request to configure the multiplexer 134 for that convert request. Thus, the analog information from all eight analog input lines 136 can be obtained in a significantly shorter period of time. A third benefit is noise management, since the entire subclocking operation can occur within one clock cycle of the SYSCLK. This is due to the fact that all of the edges of the conversion clock occur at a time that does not overlap with the clock edges of the SYSCLK that operates the digital portion of the processing system, such that any noise contribution from operation of the digital system does not interfere with the analog sampling operation.

Referring now to FIG. 9, there is illustrated a timing diagram for the subclocking operation. The convert operation is initiated in synchronization with a rising edge 902 of SYSCLK, since the processing section of the chip operates on SYSCLK. A conversion start operation is initiated with a signal CNVST, at an edge 904. When CNVST goes low at an edge 906, a START signal goes high at an edge 908. This corresponds to the track signal, which when high samples the analog signal, going low at an edge 910. This basically locks the sample analog signal onto a switched capacitor input. Thereafter, a high speed clock, ADC_CLK, is then activated, indicating that the ADC 128 is being clocked by this clock signal as the conversion clock, this being at an edge 912. The ADC_CLK is then is allowed to stabilize, in the event that it was completely off and turned on in a power up operation, after which a BUSY signal is raised high at an edge 914. Thereafter, a SAR conversion operation is initiated at an edge 916 utilizing the ADC_CLK. When the SAR conversion operation is complete, as indicated at an edge 918, the ADC_CLK signal is no longer needed and it goes low at an edge 920, indicating that the high speed clock is powered down or turned off, although it could remain in an operating mode. The BUSY signal goes low at an edge 924 and the TRACK signal goes high at an edge 926 to sample the next analog input signal.

When the SAR conversion operation is complete, the digital results are transferred to an output data register. The data will remain in this output data register until the CPU 102 is ready to retrieve the results, this being at the SYSCLK rate. The operation of the ADC 128 is completely transparent to that of the CPU 102. In the embodiment illustrated in FIG. 9, SYSCLK is indicated as being at a substantially lower frequency than ADC_CLK, but, in one embodiment wherein the ADC 128 is clocked with a 20 MHz signal and the SYSCLK is a 32 MHz signal, the difference is over 500×. Therefore, the entire conversion operation or multiple conversion operations can be achieved within only a portion of a single cycle SYSCLK. As such, noise associated with digital processing of data by the CPU is isolated from the SAR conversion operation.

Referring now to FIG. 10, there is illustrated a more detailed timing diagram of the embodiment of FIG. 9, illustrating the SAR conversion operation. In this embodiment, it can be seen that the START signal goes high at the edge 904. (It should be understood that there are numerous internal delays that are accounted for that are not detailed in the various timing diagrams, but which are needed to insure proper operation) Once the TRACK signal goes low at edge 910, the ADC_CLK signal is initiated. There can be, although it is not necessary, to allow the ADC high frequency clock to come up to speed. There will be provided a certain amount of delay 1002 for this operation. After three clock cycles, in this simplified example, the SAR conversion operation will be initiated at a clock edge 1004 of the high frequency clock. This will result in testing of the MSB during a clock period 1006, followed by testing of the remaining bits 10, 9, . . . , 0. At the end of the conversion cycle, at an edge 1008, the conversion operation is complete, this all occurring within less than one-half of a SYSCLK cycle. The data will then be transferred to the output data register in the configuration wherein only a single conversion takes place in response to a convert request. All of the data transfer, the SAR conversion operation, etc., will be facilitated at the high frequency rate of the high frequency ADC conversion clock, ADC_CLK. Since the mixed signal device is operable to operate at high frequency, all of the components thereof are capable of being operated at these high frequencies. For example, although the low clock frequency may be as low as 32 KHz, the sampling frequency of a conventional ADC is 200 KHz and the SAR clock can and will operate at a much higher frequency. Thus, it can be seen that, by providing the SAR conversion clock at a substantially higher frequency than the frequency of the system clock, SYSCLK, the throughput of the ADC is significantly increased, as compared to operating at the ADC at the lower frequency of the system clock, SYSCLK, when the system clock is configured for low frequency operation.

Referring now to FIG. 11, there is illustrated a more detailed block diagram of the internal operation of the ADC 128, which was described herein above with respect to FIG. 2. The SAR logic block 212 has associated therewith a SAR controller 102 and a SAR register 1104. The SAR controller 1102 is operable to receive the output of the comparator 208 and successively adjust the digital output of the SAR register 1104 for input to the DAC 210 in accordance with a SAR conversion algorithm, a conventional data conversion algorithm. The final digital value residing in the SAR register 1104 represents the converted digital value at the end of the conversion cycle. This is also the output that is provided to the DAC 210 on the digital bus 214 for use in the successive approximation operation. The bus 214 is interfaced with, in this embodiment, a FIFO 1106 for storage of data therein. Normally, this is a holding register or a data output register. This FIFO 1106 is operable to interface with the data bus 808, such that the CPU 102 can have access thereto, this being the system data bus. The FIFO 1106 provides an elastic data storage location that allows data to be input thereto at a faster rate than it is being extracted therefrom. Although a FIFO is described as the elastic storage device, a Random Access Memory (RAM) could be utilized.

The FIFO 1106 is controlled by the SAR controller 1102. The SAR register and SAR controller 1104 can be configured through a configuration register 1108, such that multiple samples can be taken in response to a single convert request. This convert request can be a convert request from the CPU 102 or it could be in response to internal timers in the SAR controller 1102 that result in samples of data being taken at predetermined times.

When configured for multiple samples during a conversion operation and in response to a convert request, the data will be generated faster than the CPU 102 can extract it from the ADC 128 over the data bus 808. Therefore, when the CPU 102 generates the convert request, the data will be accrued well prior to even the next clock edge of SYSCLK. Since the CPU 102 operates on instructions that can be fetched no faster than the SYSCLK rate, this data must be extracted over multiple clock cycles of the CPU. Therefore, the FIFO 1106 (or RAM), being an elastic storage buffer, can accrue this information faster than the CPU 102 can extract it.

Figure 12:
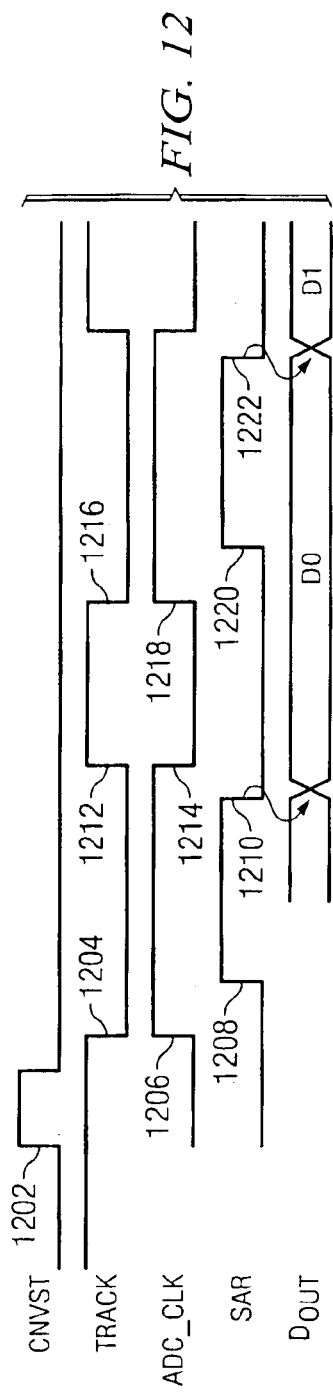
FIG. 12 illustrates a timing diagram for the Repeat instruction.

Referring now to FIG. 12, there is illustrated a timing diagram for the Repeat function, which is a function that allows a plurality of conversions to occur after a convert request is generated by the CPU 102. A convert start request is received at an edge 1202 and this results in the TRACK signal going low at an edge 1204 and the high frequency clock being valid at an edge 1206. This will initiate a first SAR conversion operation at an edge 1208 which will be completed at an edge 1210. This data will then be transferred as the data D0 in this operation. The high frequency clock can then be turned off at an edge 1214, or maintained on during this time, depending upon the power saving requirements. The TRACK signal will then go high at an edge 1212 to again sample another analog signal for a predetermined amount of time in a pre-track operation. The high frequency clock is not needed during this sampling and, therefore, could be turned off. After new data is sampled on the associated analog input line, the TRACK signal will again go low at an edge 1216, and the high frequency clock signal will again be valid at an edge 1218. This will start a second SAR conversion operation at an edge 1220, which will result in data at a time 1222, which data will be transferred as data D1. Each of these data outputs is stored in a separate location in the FIFO 1106, wherein, for each of the SAR conversion operations, a Write pointer will be incremented. It is noted that only a single convert request at edge 1202 was required in order to initiate the multiple conversion state machine operations at the high frequency clock. Additionally, although illustrated as being stored in FIFO 1106, the data could actually be processed with combinatorial logic contained within and as a part of the ADC that will allow for processing of the data to provide, for example, the average thereof. This would require an accumulator and the logic to perform a shift. Therefore, each value would be summed with the prior value and then, at the end of all of the conversion operations, the average thereof taken, or a running average could be taken. Alternatively, the accumulator could be utilized to accumulate the sum and then the processor utilized to perform the averaging operation. This would then only require a single register for storage and output of data. Of course, during the subclocking operation, the abort feature noted herein above could also be implemented in conjunction therewith.

Figure 13:
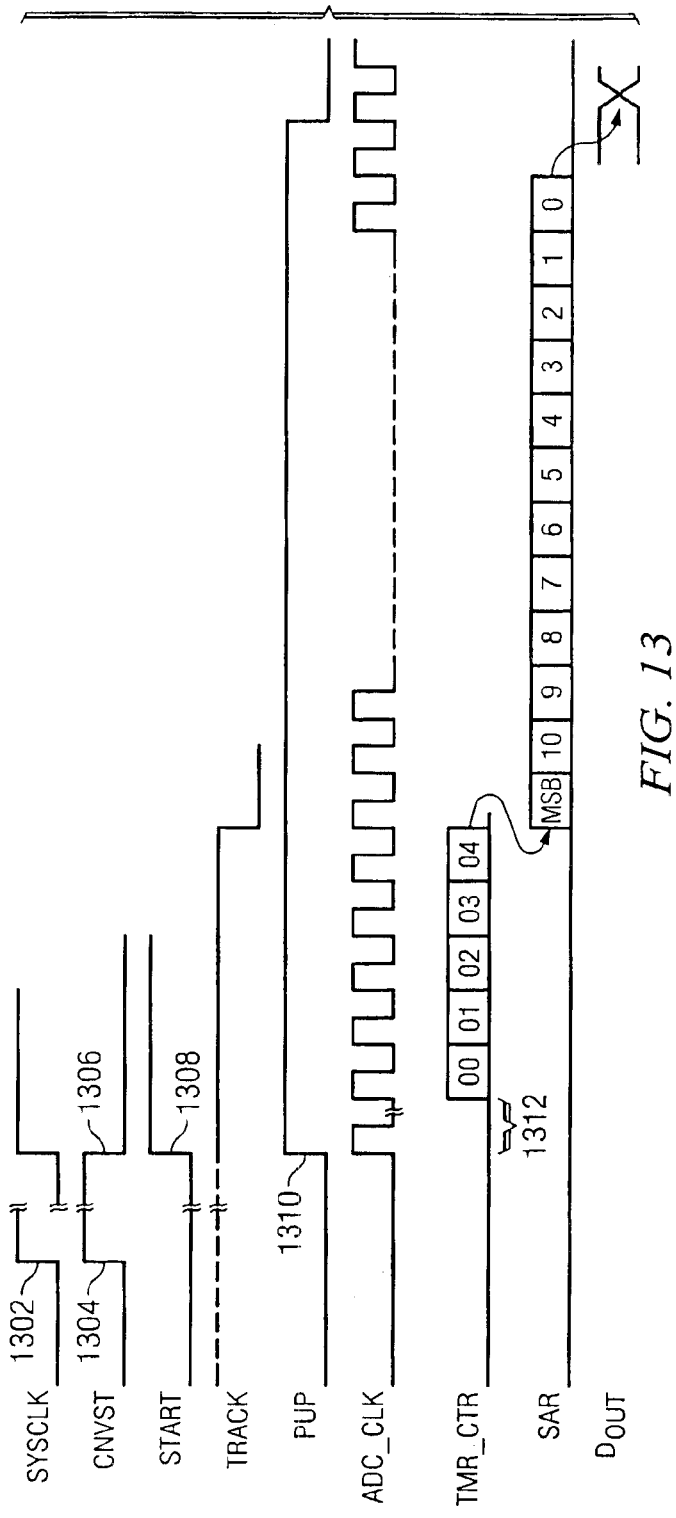
FIG. 13 illustrates a timing diagram for the post tracking feature.

Referring now to FIG. 13, there is illustrated a timing diagram for the post tracking operation wherein the ADC is powered up upon receiving the convert START request, such that some delay is required prior to initiating the conversion operation. The initial operation is initiated with a rising edge of the SYSCLK signal at an edge 1302, wherein the CNVST signal is raised high at an edge 1304. The START signal goes high at an edge 1308 and a power up signal, PUP, goes high at an edge 1310. During this time, the high frequency clock is illustrated as being operable. However, it should be understood that the high frequency clock is not connected to other circuitry at this time and, as such, it is only the circuitry associated with the high frequency clock that draws the higher power, as compared to circuitry associated with the low frequency clock operation.

During power up, the ADC 128 is powered up and the high frequency clock is powered up. The high frequency clock takes some amount of time to come up to operating speed but is well behaved, but the ADC may take longer to "settle out." There will be provided a certain period of time 1312, illustrated as being a plurality of clock cycles of the high frequency clock, four or more. When the power up signal is generated, the ADC reset function automatically raises TRACK high, but there is a period of time that the analog input signal must be present in order to have a valid sample. To ensure that there will be a sufficient amount of sample time, a post-track feature is utilized to "force" the TRACK signal high for a predetermined minimum amount of time. After the settling period 1312, which is defined by an internal counter, a post-track timer/counter is initiated. This timer/counter delays the start of the conversion operation by five high frequency clock cycles, this being dependent upon a register value. Thereafter, TRACK goes low and the conversion operation is begun.

Figure 14:
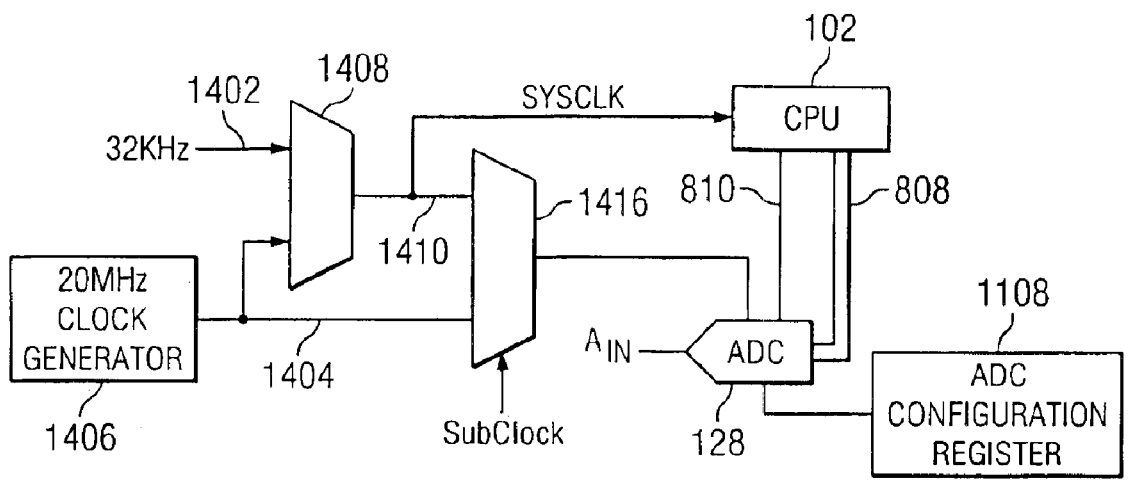
FIG. 14 illustrates a more detailed block diagram of the clock multiplexing function.

Referring now to FIG. 14, there is illustrated a more simplified diagram than that of FIG. 8. In this embodiment, there are provided only two clocks, the 32 KHz clock on a line 1402 and a high frequency clock on a line 1404 that is generated by a high frequency clock generator 1406. The 32 KHz clock and high frequency clock are input to two inputs of a multiplexer 1408, having one output on a line 1410. This is the SYSCLK output that goes to the CPU 102. Additionally, the output of multiplexer 1408 is input to one input of an ADC multiplexer 1416, the other input thereof connected to the high frequency clock line 1404. The ADC multiplexer 1416 is operable to select between the SYSCLK signal or the high frequency clock output, such that the system 1414 can operate on an independent clock to that of the ADC 128. The multiplexer 1416 provides the clock input to the ADC 128.

Referring now to FIGS. 15a–15c, there are illustrated diagrams of the ADC registers, there being a tracking register, ADC0TK, a configuration register ADC0CF, and a control register, ADC0CN, the "0" representing that more than a single ADC could be provided on the integrated circuit. Referring specifically to FIG. 15a, the ADC0TK register has associated therewith a number of bits. There is provided four bits for the ADC Burst Power-Up time (ADCPWR). This field controls the Power-Up time during ADC Burst conversions. The ADC is enabled a minimum of 200 nsec before the first conversion takes place. There is provided a single bit for the ADC Pre-Track Enable operation (PRETRK). When set, the ADC will track continuously between conversions. There is provided a single bit for the ADC Post-Track Enable operation (POSTTRK), which when set, will control the ADC to track for 2*(ADCTM+ 1)/ADC_CLK between each convert-start and the start of conversion. The ADC track time (ADCTM) is a field of two bits that controls the post-tracking time as described herein above.

The configuration register of FIG. 15b controls the basic configuration of the system. There are provided five bits for the ADC Clock Rate Control (ADCSC), which field controls the sample clock rate of the ADC. $F_{CLK}$ is the current system clock when the Burst Enable is not selected and is a maximum of 25 MHz when Burst Enable is selected. There are provided two bits for the ADC Repeat Count (ADCRPT), which is a field that controls the number of conversions taken between the ADC interrupts or during ADC Conversion Bursts. Note that after the end of a conversion, an interrupt flag is set, but when the conversion Repeat Count is not "1," then the interrupt is set only after the last conversion. The ADC Calibration Enable (CALEN) is an enable bit that enables the ADC calibration mode. This feature is not described herein.

Referring to the register of FIG. 15c, the control bits provide various control functions. There is a single ADC enable bit (ADCEN) that enables the ADC. There is provided a single ADC Burst Mode Enable (BURSTEN) which enables the ADC for burst conversions. In the burst mode, as described herein above, the ADC operates from an internal high frequency oscillator, 20 MHz in the disclosed embodiment. On each convert start signal, the ADC is enabled and allowed to stabilize for 200 nsec*ADCPWR, such that the Power-Up time is incremented in increments of 200 nsec. One or more conversions (based upon the value of ADCRPT) is then performed and the ADC is powered down. If ADCEN is also set, the power-up and power-down operations are skipped. If ADCEN=0, the ADC should be configured for post-tracking. Otherwise, either pre-tracking or post-tracking can be utilized. The ADC Conversion Complete Interrupt (ADCINT) bit provides an interrupt flag that is set at the end of each conversion. If the conversion Repeat Count (ADCRPT) is not "1," the interrupt is set only after the last conversion. The ADC Busy (ADBUSY) bit writes to the ADBUSY when ADCCM=0 initiates the conversion sequence. Reads of ADBUSY (=1) indicate when a conversion is in progress. The ADC Window Compare Interrupt (ADWINT) provides an interrupt flag that is set at the end of a conversion, which satisfies the window compare conditions for the abort feature (or other normal compares). If the conversion repeat count (ADCRPT) is not "1," the interrupt is set only after the last conversion. The ADC Results Adjust Bit (ADRJUST) is set such that, when "0," the ADC results are right justified, otherwise the results are left justified. The ADC Conversion Start Source (ADCCM) provides a field that sets the source of conversion.

Referring now to FIG. 16, there is illustrated a flow chart for the subclocking feature, which is initiated at a block

1602. The program then flows to a decision block 1604 to determine if a convert request has been received. As described herein above, this convert request can be in response to an external rising edge of the external CNVST signal or in response to a timer overflow that constitutes an internal request or writes to ADBUSY. When the convert request has been received, the program flows to a decision block 1606 to determine if the BUSY flag is set, indicating that the convert request cannot be serviced and it will be ignored. When the system is ready to service a request, the program flows along the "N" path from decision block 1606 to a decision block 1608 to determine if the power-up feature has been selected. If so, this indicates that the ADC is to be powered up during the convert operation and the program flows along the "Y" path to a function block 1610 to apply power to the ADC and then to a function block 1612 to allow a certain amount of time to elapse before conversion is to proceed after tracking is initiated to sample the analog value, as indicated by a decision block 1614. When an appropriate amount of delay has passed, the program flows to a function block 1622 to run the SAR conversion algorithm at the high frequency clock rate, which was selected by the CPU 102 in a prior setup operation. The program will stay in the SAR conversion algorithm until complete, as indicated by decision block 1624, at which time the program flows along a "Y" path therefrom to a function block 1628 to transfer data and then set the interrupt bit. The program then flows to a decision block 1630 to determine if a power-down operation is to be performed, this being the mode that would be present if the power-up feature were selected. If so, the program flows along a "Y" path to a function block 1632 to remove power from the ADC and then to a Return block 1634. If the power-down feature has not been selected, the program flows from the decision block 1632 to the Return Block 1634.

Referring now to FIG. 17, there is illustrated a flow chart depicting the operation of multiple conversions within a convert request. The program is initiated at a block 1702 and then proceeds to a decision block 1704 to determine if a convert request has been received. In the high frequency mode, which is the subject of this flow chart, the program will then flow to a SAR conversion block 1706 to perform the SAR conversion operation at the high frequency clock rate. This is similar to the operation with respect to that described in the flow chart of FIG. 16. The program then flows to a decision block 1708 to determine if the SAR conversion is complete. When complete, the program flows along a "Y" path to a decision block 1710 to determine if the BURST_EN function is selected. If so, the program then flows to a decision block 1714 to determine if any of the data that has been previously collected is to be processed. If so, the program will flow along a "Y" path to a function block 1716 to subject this data to processing. This processing might be such as maintaining a running average with a prior value. If no processing is required, then the program will flow along a "N" path to a function block 1718 to store the data in the FIFO (or RAM). If subject to processing, however, the flow chart will flow from block 1716 to block 1720 to store the data and then the program will flow to a decision block 1722 in order to determine if the Repeat operation is complete, i.e., have all the conversions taken place within the single convert request cycle. If not, the program will flow along a "N" path back to the input of the SAR conversion block 1706 to repeat the operation until complete, at which time it will flow along a "Y" path from a decision block 1722 to a Return block 1724. It is noted that the tracking of the analog input signal will be continuous during this time.

Figure 18:
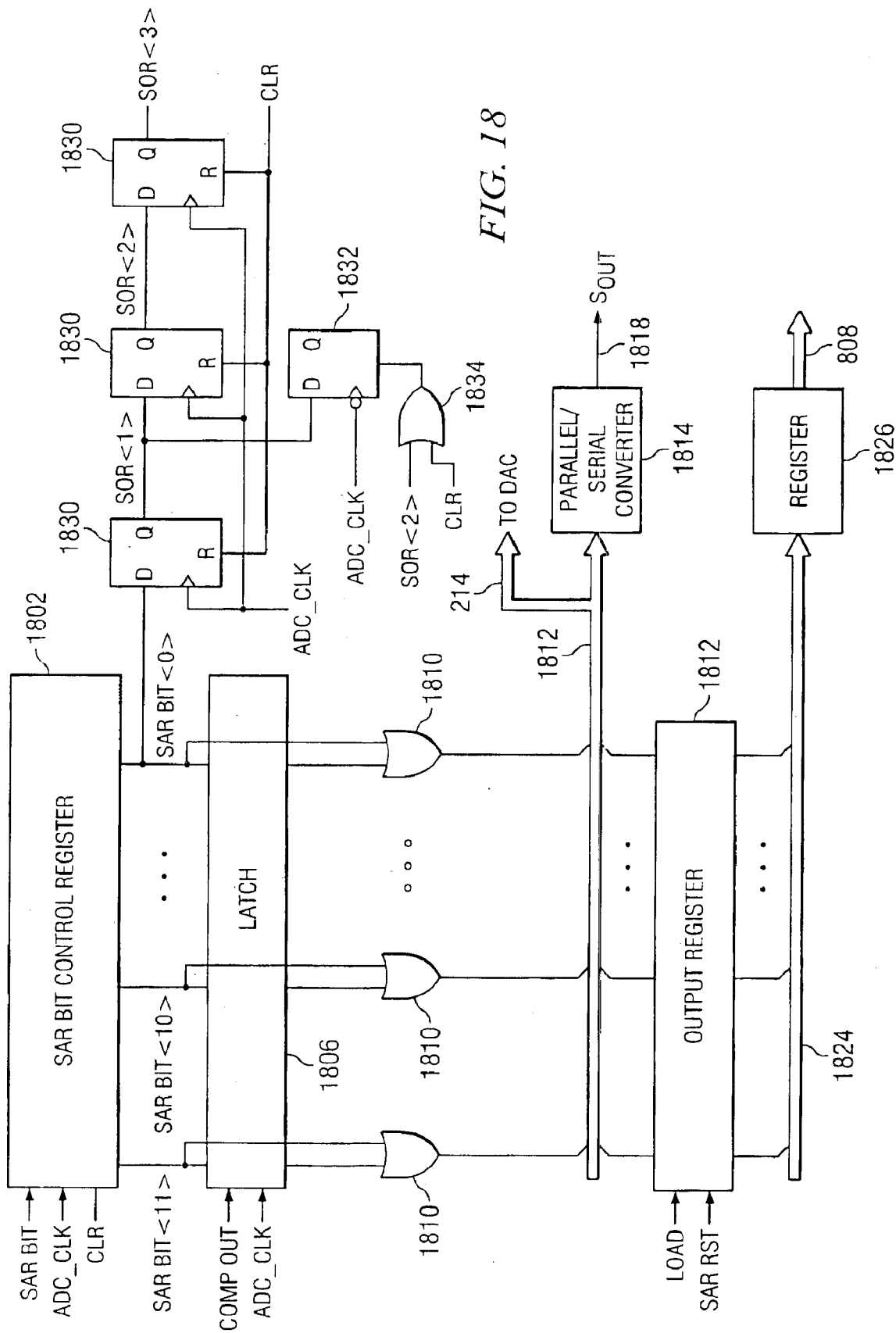
FIG. 18 illustrates a logic diagram for the SAR controller and SAR register.

Referring now to FIG. 18, there is illustrated a logic diagram for the SAR controller 1102 and SAR register 1104. There is provided a SAR bit control register 1802 that is functionally equivalent to the "SAR bit register" of FIG. 6. This provides a bit that is sequenced through the registers indicating which bit of the SAR operation is being tested. Initially, there is a signal SAR BIT that is input to the register 1802 and raised high on a rising edge of the ADC clock. The register 1802 is clocked with the ADC clock, and is reset with a CLR signal. The first output thereof is the MSB bit that is being tested, SAR_BIT <11>. Each successive bit being tested provides a corresponding output, only one of which is high at any given time. Each of the outputs of the register 1802 is input to a clocked latch 1806. The clocked latch is operable on each rising edge of the ADC clock to latch the associated output of the comparator if the comparator output indicates a positive compare or indicates that the bit value for the bit being tested is to remain high, i.e., it is a "kept" bit. When this is latched, the register 1802 is then clocked such that the next bit is tested. In operation, SAR BIT is raised high on the input to the first register 1802 on the first rising edge of the ADC clock to initiate the conversion operation and test the MSB and, on the next rising edge of the ADC clock, SAR BIT is taken low and the second MSB is tested and so forth, with the associated output of the clocked latch 1806 updated. This clocked latch therefore provides the basic function of the SAR register, i.e., the history aspect thereof.

Each of the outputs of the register 1802 is input to one input of a associated multiple input OR gate 1810, and each of the associated outputs of the clocked latch are connected to the other input thereof. The output of each of the OR gates 1810 for each of the bits tested is connected to a bus 1812. Therefore, whenever a bit is being tested, this will force the output of the associated OR gate 1810 high and, when finished testing, the latched value will be forced high if it is tested as a "1" or low if it is a "0." Thus, for every ADC clock rising edge, both the current bit being tested will be high and the previous bits tested as being high will remain high. This is provided to the ADC 210 on the bus 214, which is the same as the bus 1812. In addition, the bus 1812 is input to a parallel/serial converter 1814, which provides the function of the multiplexer 216 in FIG. 2. This provides a serial data output on a line 1818. This will be described in more detail herein below.

In order to provide an output for the CPU 102, there is provided a second register 1820. The register 1812 has an associated bit for each bit tested. Each input of the register 1820 is interfaced to the associated bit on the bus 1812 with the clock input of the register 1820 connected to a LOAD signal and the reset input thereof connected to a SAR reset signal. Each of the outputs of the register 1820 are connected to respective lines of a bus 1824, which is then connected to an output register 1826 for interface with the bus 808.

The output of the register 1802 associated with SAR BIT <0> is input to a SAR overflow register flip flop 1830, there being three of these flip flops 1830. This allows the SAR bit that is walked through the register 1802 to be delayed such that control signals can be derived therefrom. The output of the first of the flip flops 1830, the SOR <1> bit, is input to the D-input of a flip flop 1832, which is clocked by the inverse of the ADC_CLK, such that the output occurs on the falling edge thereof to provide the LOAD signal. Thus, the LOAD signal is provided 1.5 clock cycles later than the last test, the SAR BIT <0>. The reset input is connected to the output of an OR gate 1834, with one input thereof connected to the output of the second of the registers 1830, the SOR <2> output, and the other input of the OR gate 1834 connected to the CLR signal.

Referring now to FIG. 19, there is illustrated a logic diagram of the parallel-to-serial converter 1814, the multiplexer 216. This structure is configured with a plurality of drivers 1902, each having the input thereof connected to one of the output bits on bus 1812, SAR <11>, SAR <10>, . . . SAR <0>, for a 12-bit ADC. The driver 1902 associated with the SAR <11> bit is selected or gated with the test bit, the SAR BIT <10> test bit, output by the Q-output of the flip flop 1802 associated with the second of the flip flops 1802. As such, when the next lower bit is being tested, the previous bit is being output. The last of the drivers 1902 receives the input SAR <0>, the LSB, and is gated by the output of the first of the flip flops 1830, the SAR overflow register, the bit SOR <1>. As such, this provides on the output line 1818 the previous bit tested to the current bit being tested.

Referring now to FIG. 20, there is illustrated an alternate embodiment wherein a plurality of FIFOs 2002 are provided, each associated with one of a plurality of analog inputs, there being eight analog inputs in this disclosed embodiment. Therefore, there will be a FIFO <7>, FIFO <7>, . . . , FIFO <0>. Each of the FIFOs 2002 has the output thereof interfaced with the output bus 808. The SAR logic block 212 is operable such that each of the inputs during a conversion operation in response to a convert request is tested one or multiple times. Thus, the SAR logic block 212 will control the analog multiplexer 134 to select one of the eight analog input lines 136, in this disclosed embodiment. The operation can operate in two ways. First, each FIFO can have a plurality of stored locations with the associated analog input line selected and then a plurality of conversions performed on that data in sequence and then stored therein and then the multiplexer changed to the next analog input line, and then the next FIFO 2002 populated. Alternatively, the analog multiplexer can be operated such that the first conversion result is based on the first analog input line and then the multiplexer changed for the next analog input line, the data sampled and converted and stored in the next FIFO 2002.

Referring now to FIG. 21, there is illustrated a timing diagram for the second operation described above with respect to FIG. 20. The convert start signal is initiated at a rising edge 2102 and then a power up signal initiated at an edge 2104. This will be followed with activation of the ADC clock at an edge 2106 and the track signal will be activated such that the data on the selected line is then sampled. The conversion operation for the first conversion is initiated at an edge 2108 where the track signal goes low and then the conversion started at an edge 2110 for the first conversion. This conversion will be associated with the first analog input line and the results stored in the first FIFO for bit <7>. This will occur after the conversion operation is complete at an edge 2112. The track signal will then go high again at an edge 2114 and the analog multiplexer 134 will be controlled to select the next analog input line to be sampled. This will result in successive conversions of analog input data to be performed at a high frequency rate without requiring that the CPU 102 provide another convert start request; in fact, the entire conversion operation will take place within less than a single SYSCLK clock cycle. This will allow each of the FIFOs 2002 to be populated and that is only necessary for the CPU 102 to access the data bus 808 and the contents of the contents of the FIFOs 2002, these FIFOs 2002 requiring some type of enable and read pointer control, which is not shown, but which is conventional circuitry.

Although the preferred embodiment has been described in detail, it should be understood that various changes, substitutions and alterations can be made therein without departing from the spirit and scope of the invention as defined by the appended claims.

What is claimed is:

1. A method for clocking the operation of a SAR analog-to-digital converter (ADC), comprising the steps of:

providing a low frequency clock and a high frequency clock;

tracking an analog input voltage during a tracking phase to sample the value thereof;

initiating a conversion cycle referenced to an edge of the low frequency clock;

converting the sampled data in a conversion operation during a data conversion cycle, which conversion operation requires a plurality of conversion clock cycles; and controlling the timing of at least a portion of the conversion operation during the data conversion cycle utilizing the high frequency clock as the conversion clock.

2. The method of claim 1, wherein the step of controlling the at least a portion of the conversion operation comprises utilizing the high frequency clock during the conversion cycle to control the timing of the at least a portion of the conversion operation proximate in time to the step of initiating.

3. The method of claim 1, wherein the at least a portion of the conversion operation comprises substantially all of the conversion operation.

4. The method of claim 1, wherein the SAR ADC has an n-bit resolution and the conversion operation includes the steps of:

testing each of the n-bits during the conversion operation to determine the logic state thereof, the timing thereof determined by a conversion clock that generates the conversion clock cycles;

generating the conversion clock from the low frequency clock during the tracking phase; and during the step of controlling, generating the conversion clock from the high frequency clock for the at least a portion of the conversion operation.

5. The method of claim 4, wherein the step of generating the conversion clock comprises generating the conversion clock substantially only during the at least a portion of the conversion operation.

6. The method of claim 4, wherein the at least a portion of the conversion operation does not include the time to test all of the n-bits.

7. The method of claim 4, wherein the at least a portion of the conversion operation includes the time to test substantially all of the n-bits.

8. The method of claim 4, wherein the at least a portion includes all of the n-bits.

9. The method of claim 1, wherein the step of initiating is in response to the generation of a convert initiation signal generated by a processing unit.

10. The method of claim 9, wherein the processing unit operates from the low frequency clock and, during the step of controlling the timing of at least a portion of the conversion operation, the processing unit continues to operate on the low frequency clock.

11. The method of claim 1, wherein the SAR ADC operates in a power up mode and in a power down mode, when in the power down mode, further comprising the steps of:

operating the SAR ADC in a low power mode;

receiving a power up signal and, in response thereto:
    applying power to the SAR ADC,
    initiating the tracking operation,
    delaying the start of the conversion cycle by a predetermined delay to allow the SAR ADC to stabilize, and after the end of the conversion cycle, removing power to the SAR ADC.

12. The method of claim 11, and further comprising the step of introducing a known programmable amount of delay to force the tracking operation to continue for that programmable amount of delay and delaying the start of the conversion cycle for the programmable amount of delay.

13. A method for operating a SAR ADC in a mixed signal processing system, comprising the steps of:

operating a digital processing section on a first and low frequency clock;

generating a convert request to instruct the SAR ADC to initiate a conversion operation;

in response to the generation of the convert request, operating the SAR ADC in a data conversion operation on a second and high frequency clock that has a clock frequency that is higher than the frequency of the low frequency clock to convert an analog value on an analog input to a digital value in a SAR conversion cycle;

storing the resultant digital value for processing by the digital processing section; and after storage of the resultant digital value, processing the resultant digital value by the digital processing section.

14. The method of claim 13, wherein the conversion operation is completed within at least a single cycle of the low frequency clock.

15. The method of claim 13, wherein:

the step of operating the SAR ADC in a data conversion operation comprises, in response to the generation of the convert request, operating the SAR ADC in a plurality of data conversion operations on the second and high frequency clock to convert analog values on at least one analog input to a plurality of corresponding digital values, each in an associated SAR conversion cycle;

the step of storing operable to store a representation of the resultant digital values; and the step of processing operable to process the representation of the resultant digital values.

16. The method of claim 15, wherein the step of storing is operable to store each of the resultant digital values separately.

17. The method of claim 15, wherein the step of storing is operable to store an accumulated digital value of the resultant digital values as a single value.

18. The method of claim 17, wherein the resultant digital values are all related to a single analog input.

19. The method of claim 18, wherein the step of processing by the digital processing section is operable to determine the average of the accumulated digital value.

20. The method of claim 15, where there are provided a plurality of analog inputs, each operable to receive a separate analog signal, and further comprising the step of selecting with a multiplexer select ones of the analog inputs for interface with the SAR ADC for each of the data conversion operations carried out thereby in response to the generation of the convert request.

21. The method of claim 15, wherein all of the data conversion operations are completed within at least one cycle of the low frequency clock.

22. A processing system including a SAR analog-to-digital converter (ADC), comprising:

a low frequency clock and a high frequency clock;

a sampling device for tracking an analog input voltage during a tracking phase to sample the value thereof;

a conversion engine operable to initiate a conversion cycle referenced to an edge of the low frequency clock;

said conversion engine converting the sampled data in a conversion operation during a data conversion cycle, which conversion operation requires a plurality of conversion clock cycles; and a timing engine for controlling the timing of at least a portion of the conversion operation during the data conversion cycle utilizing the high frequency clock as the conversion clock.

23. The system of claim 22, wherein said timing engine is operable to utilize said high frequency clock during the conversion cycle to control the timing of the at least a portion of the conversion operation proximate in time to said conversion engine initiating the conversion cycle.

24. The system of claim 22, wherein the at least a portion of the conversion operation comprises substantially all of the conversion operation.

25. The processing system of claim 22, wherein the SAR ADC has an n-bit resolution and said conversion engine includes:

a bit tester for testing each of the n-bits during the conversion operation to determine the logic state thereof, the timing thereof determined by a conversion clock that generates the conversion clock cycles;

a conversion clock for generating the conversion clock from the low frequency clock during the tracking phase; and said timing engine operable to generate the conversion clock from said high frequency clock for the at least a portion of the conversion operation.

26. The processing system of claim 25, wherein said timing engine is operable to generate said conversion clock substantially only during the at least a portion of the conversion operation.

27. The processing system of claim 25, wherein the at least a portion of the conversion operation does not include the time to test all of the n-bits.

28. The processing system of claim 25, wherein the at least a portion of the conversion operation includes the time to test substantially all of the n-bits.

29. The processing system of claim 25, wherein the at least a portion includes all of the n-bits.

30. The processing system of claim 22, wherein said conversion engine is operable to initiate said conversion operation in response to the generation of a convert initiation signal generated by a processing unit.

31. The processing system of claim 30, wherein said processing unit operates from said low frequency clock and, during controlling the timing of at least a portion of the conversion operation by said timing engine, said processing unit continues to operate on said low frequency clock.

32. The processing system of claim 22, wherein the SAR ADC operates in a power up mode and in a power down mode, when in the power down mode, said conversion engine operable to:

operate the SAR ADC in a low power mode;

receive a power up signal and, in response thereto:

apply power to the SAR ADC, initiate the tracking operation, delay the start of the conversion cycle by a predetermined delay to allow the SAR ADC to stabilize, and after the end of the conversion cycle, remove power to the SAR ADC.

33. The processing system of claim 32, and further comprising a delay block for introducing a known programmable amount of delay to force the tracking operation to continue for that programmable amount of delay and delaying the start of the conversion cycle for the programmable amount of delay.

34. A mixed signal processing system for controlling the operation of a SAR ADC, comprising:

a digital processing section;

a first and low frequency clock for operating said digital processing section;

a second and high frequency clock that has a clock frequency that is higher than the frequency of said low frequency clock;

said digital processing section generating a convert request to instruct the SAR ADC to initiate a conversion operation;

a conversion engine for, in response to the generation of the convert request, operating the SAR ADC in a data conversion operation on said second and high frequency clock to convert an analog value on an analog input to a digital value in a SAR conversion cycle;

a memory for storing the resultant digital value for processing by said digital processing section; and after storage of the resultant digital value in said memory, said digital processing section processing the resultant digital value.

35. The processing system of claim 34, wherein the conversion operation is completed within at least a single cycle of the said low frequency clock.

36. The processing system of claim 34, wherein:

said conversion engine, in response to the generation of the convert request, operating the SAR ADC in a plurality of data conversion operations on said second and high frequency clock to convert analog values on at least one analog input to a plurality of corresponding digital values, each in an associated SAR conversion cycle;

said memory operable to store a representation of the resultant digital values; and said digital processing section operable to process the representation of the resultant digital values.

37. The processing system of claim 36, wherein said memory is operable to store each of the resultant digital values separately.

38. The processing system of claim 36, wherein said memory is operable to store an accumulated digital value of the resultant digital values as a single value.

39. The processing system of claim 38, wherein the resultant digital values are all related to a single analog input.

40. The processing system of claim 39 wherein said digital processing section is operable to determine the average of the accumulated digital value.

41. The processing system of claim 36, where there are provided a plurality of analog inputs, each operable to receive a separate analog signal, and further comprising a multiplexer for selecting select ones of the analog inputs for interface with the SAR ADC for each of the data conversion operations carried out by said conversion engine in response to the generation of the convert request by said digital processing section.

42. The processing system of claim 36, wherein all of the data conversion operations are completed within at least one cycle of the low frequency clock.

\* \* \* \* \*